United States Patent [19]
Reele

[11] Patent Number: 5,565,674
[45] Date of Patent: Oct. 15, 1996

[54] OPTICAL DETECTION AND SIGNAL CONDITIONING PACKAGE

[75] Inventor: Samuel Reele, Rochester, N.Y.

[73] Assignee: Eastman Kodak Company, Rochester, N.Y.

[21] Appl. No.: 305,124

[22] Filed: Sep. 13, 1994

[51] Int. Cl.$^6$ ............................................. G11B 7/00
[52] U.S. Cl. ..................... 250/239; 250/201.5; 250/216; 369/44.11
[58] Field of Search ............................. 250/201.5, 239, 250/216; 369/44.11, 44.12, 44.42, 110, 120

[56] References Cited

U.S. PATENT DOCUMENTS

| | | | |
|---|---|---|---|
| 4,792,674 | 12/1988 | Hirano | 250/239 |
| 4,945,529 | 7/1990 | Ono et al. | 250/237 G |
| 5,050,153 | 9/1991 | Lee | 369/112 |

*Primary Examiner*—Stephone Allen
*Attorney, Agent, or Firm*—Raymond L. Owens

[57] ABSTRACT

Disclosed is an integrated optical detection packaging assembly for mounting and aligning a focus and tracking photo detector array and front facet detectors to an optical read/write head. A flat elongated leadframe having a plurality of conductive fingers extending substantially orthogonal to the longitudinal axis of the leadframe and having conductive wing areas extending along the longitudinal axis to opposite ends of the leadframe provides a support for the mounting of the packaged components to the read/write head of a CD reader/writer. The conductive wing areas have alignment indicia for facilitating the aligning of a focus and tracking photo detector array, carried by the support, to the optical reader/writer. A ceramic substrate is attached to the leadframe and a focus and tracking photo detector array is attached to the ceramic substrate and to the conductive fingers of leadframe. Front facet detectors are attached to the ceramic substrate and to the conductive fingers of said leadframe to complete one embodiment of the package.

4 Claims, 5 Drawing Sheets

OPTICAL DETECTION AND SIGNAL CONDITIONING PACKAGE

CROSS-REFERENCE TO RELATED APPLICATIONS

The present application is related to:

U.S. application Ser. No. 08/234,446, filed Apr. 28, 1994, by Reele and Korus, and entitled "Integrated Laser Module", having Kodak Docket No. 69,154.

U.S. application Ser. No. 08/259,428, filed Jun. 14, 1994, by Kay and Gage, and entitled "Read/Write Laser-Detector-Grating Unit (LDGU) with an Orthogonally-Arranged Focus and Tracking Sensor System", having Kodak Docket No. 69,746.

U.S. Application Ser. No. 08/259,587, filed Jun. 14, 1994, by Brazas, and entitled "Multi-Element Grating Beam Splitter with a Reflection Grating Element for Use in Font-Facet Subtraction", having Kodak Docket No. 70,447.

U.S. application Ser. No. 08/291,253, filed Aug. 16, 1994, by Reele, and entitled "Laser Driver ASIC Chip", having Kodak Docket No. 69,959.

FIELD OF INVENTION

The present invention relates to the field of reflected laser light detection and signal conditioning for optical recording systems, and more specifically to the field of integrated packaging of the laser with the detection optics and the associated electronics for each.

BACKGROUND OF THE INVENTION

In optical recording CD systems, it is highly desirable to integrate the optical source, beam splitter, and a detector array into an integrated package generally referred to as a laser-detector-grating unit (LDGU). A number of LDGU-based systems are described in W. Ophey, "Compact Optical Light Paths," Jpn. J. Appl. Phys., Vol. 32, Part 1, No. 11B, pp. 5252–5257, November 1993. Other LDGU-based systems are described in, for example, U.S. Pat. Nos. 5,050,153 and 4,945,529.

The placement of the electronics necessary to support small form factor heads presents a number of technical challenges. Some of these challenges are to optimize the signal-to-noise ratio, minimize transmission line effects (to permit fast rise and fall times) and to provide signals that accurately represent focus and tracking front facet and RF sum. To meet some of these challenges, it is extremely important to have matched detectors as well as matched amplifiers, since focus and tracking error signals are usually generated by an algebraic function of two or more detector signals. Absolute matching, as well as good phase margins, are important for an accurate signal representation of derived focus or tracking error signals. In order to insure that the signals are accurately defined, it is necessary to include matching parameters such as transimpedance matching (typically 1%), voltage offset (typically 6 mv for critically matched amplifiers) and voltage offset drift with temperature typically (40 $\mu$v/Deg C.) for critically matched preamplifiers.

In addition, high sampling rates place severe constraints on overload recovery time (typically <25 nsec), settling time (<10 nsec for 1% accuracy), bandwidth (typically 70 MHz min), and slew rate (typically 125 v/$\mu$sec {volts per microsec}).

With the close proximity of preamplifiers and detectors come some rather tight coupling constraints (typically −45 to −55 db) for minimizing focus error crosstalk into tracking error signals and vice versa. In addition, noise parameters such as input referred current noise spectral density, typically 2-pa/sqrt (Hz) must be maintained.

Integrated circuit manufacturers today do not offer preamplifiers with the required matching voltage offset, noise, slew rate, bandwidth and recovery time parameters required to optimize performance in an optical recording CD system operating at 8–12× write speeds.

The present invention removes the foregoing limitations by forming a custom optical detection package utilizing an internal multi-chip module, a matched monolithic detector array, and preamplifiers monolithically fabricated in one custom ASIC.

SUMMARY OF THE INVENTION

The functionality requirements for the present integrated package are that it detects reflected light from a laser and conditions the resultant electrical signals for a future derivation of focus, tracking error signals, provides front facet detection signals (for laser servo control) and provides a composite RF signal for a "compact disc" system (i.e., audio as well as optical).

In a preferred embodiment of the present invention, the packaging assembly for mounting and aligning a focus and tracking photo detector array and front facet detectors to an optical read/write head is comprised of:

a flat elongated leadframe having a plurality of conductive fingers extending substantially orthogonal to the longitudinal axis of said leadframe and having conductive wing areas extending along said longitudinal axis to opposite ends of said elongated leadframe, said conductive wing areas having alignment indicia for aligning a focus and tracking photo detector array to the optical read/write head;

a ceramic substrate conductively attached to said leadframe;

a focus and tracking photo detector array conductively attached to said ceramic substrate and to the conductive fingers of said lead frame; and a front facet detector conductively attached to said ceramic substrate and to the conductive fingers of said leadframe.

From the foregoing it can be seen that it is a primary object of the present invention to provide a compact integrated optical detection package having improved high speed capability for reading and/or writing to an optical recording medium.

It is another object of the present invention to provide an optical detection package that provides improved thermal separation between closely positioned electrical and optical components.

The above and other objects of the present invention will become more apparent when taken in conjunction with the following description and drawings wherein like characters indicate like parts and which drawings form a part of the present specification.

DETAILED DESCRIPTION OF THE INVENTION

Figure 1:
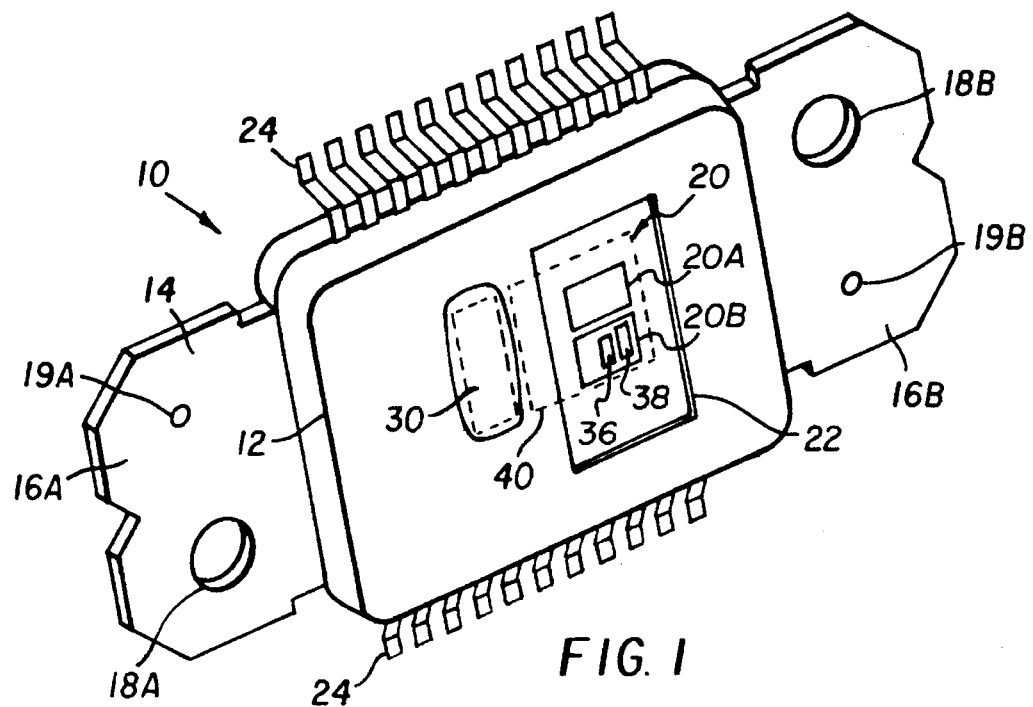
FIG. 1 illustrates the optical detection package in perspective view.

Referring to FIG. 1, the optical detection package 10 has a molded, optically clear, body 12 surrounding the central portion of a wing-shaped support 14. The support 14 has two wing-shaped portions 16A and 16B with mounting holes 18A and 18B extending there through for receiving mounting screws (not shown) for mounting the optical package 10 to the head of an optical CD read/write system. A photo detector array 20 is affixed to a ceramic substrate 40. The photo detector array 20/ceramic substrate 40 and an ASIC 30 are affixed to the support 14. The molded body 12 has an indented surface 22 which is optically flat, clear of bubbles, and inclusions. This indented surface acts as a "window" for the reflected laser light which impinges on the photo detector array 20 when the optical detection package 10 is in use.

Figure 3:
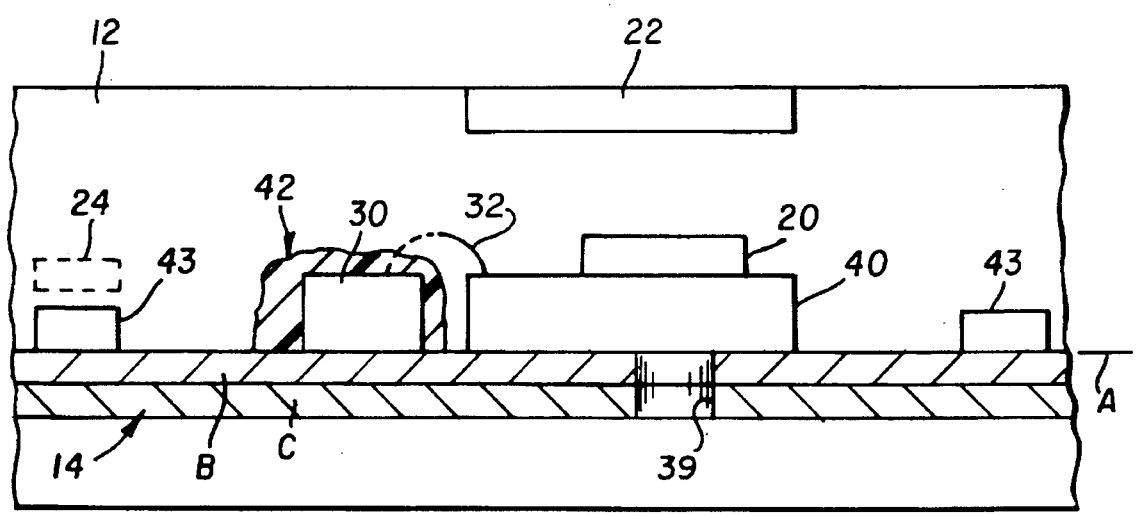
FIG. 3 illustrates a section view taken along the section line 3—3 in FIG. 2.

A plurality of conductive leadframe fingers 24 are fused or welded to the wing-shaped support 14. The support 14 forms a stable, flat surface, which surface is coplanar with the window 22, for die mounting the photo detector array 20. This enables accurate positioning of the photo detector array relative to the support 14. A pair of tooling holes 19A and 19B provide a means to accurately position the photo detector array 20 to the optics in the head of the optical read/write system. In addition, the support 14 provides a very low thermal impedance path to heat sink the ASIC (500–700 MV of power) while minimize heat flow to the photo detector array. Results of less than 0.25 Deg C. rise over 50 mils of the ASIC, for amplifier matching parameters such as output offset voltage, have been achieved. In order to insure that maximum heat sinking is provided as well as minimal flexure due to ambient temperature changes along the orthogonal axis of support 14, two or more metal sheets, labeled B and C in FIG. 3, are laminated together via a conductive adhesive or resistive welding. The metal sheets are selected to be complimentary for the above two requirements. For instance Cu (copper) may have a high thermal conductivity (9.3) and a high thermal expansion (3.3), whereas brass may have a low thermal conductivity (2.7) and a low thermal expansion (2.7). The following metal combinations have been successfully used:

1) Cu+brass
2) Cu+brass+Cu
3) brass+brass
4) beryllium Cu+Cu
5) Cu+Inv+Cu

For similar materials such as brass+brass, the laminate performs much the same way as plywood does for rigidity. For nonsimilar materials such as brass+Cu, the lamination allows the materials to compliment one another so as to provide a z-axis flexure of less than 1 micron along the orthogonal axis of 14 over a temperature range of 40 Deg C. with a package thermal resistance of less than 5 Deg C./watt. The z-axis is defined as the axis orthogonal to the major surface plane of the wing-shaped support 14.

Figure 4:
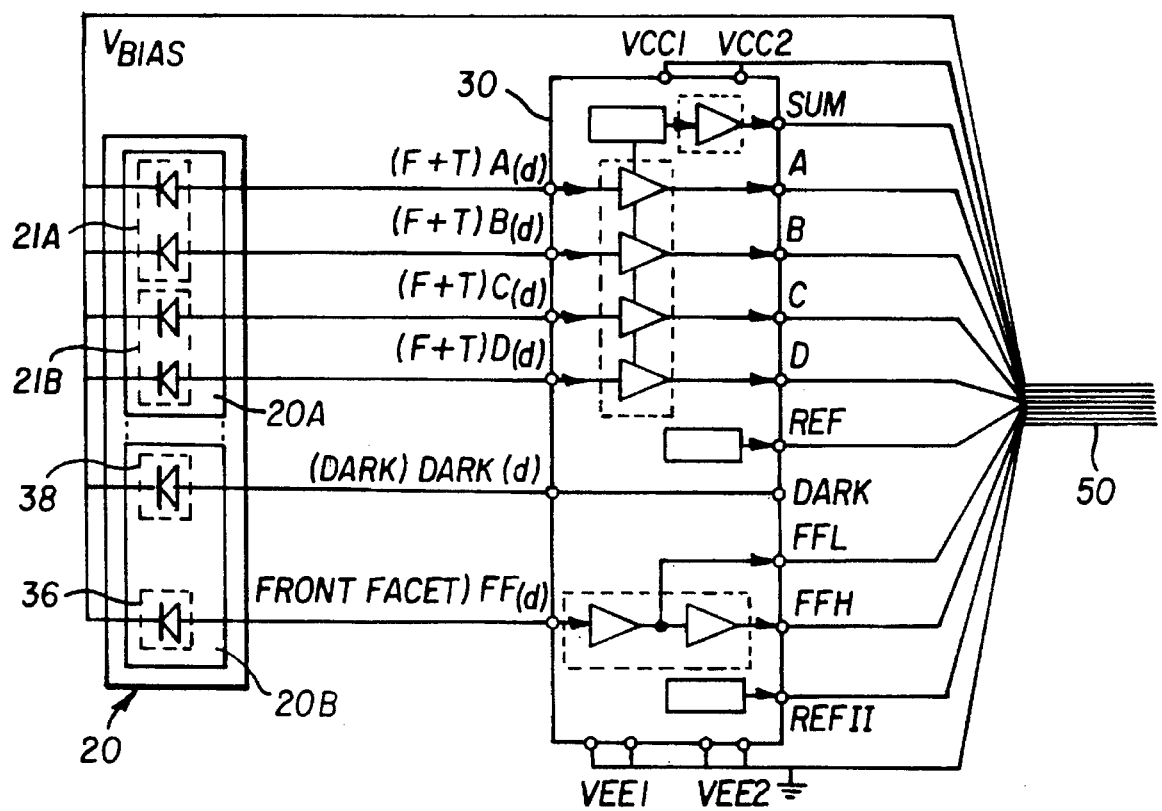
FIG. 4 is a functional block diagram illustrating the electronics in the optical detection package of FIG. 1.

The leadframe fingers 24 are used to connect the internal electronics of the optical detection package to the outside world, generally through a flex cable 50 (shown in FIG. 4). Standard wirebonds 32 connect the leadframe fingers 24 to the input/output pads of the ASIC 30, detector 20, and the ceramic 40.

Figure 2:
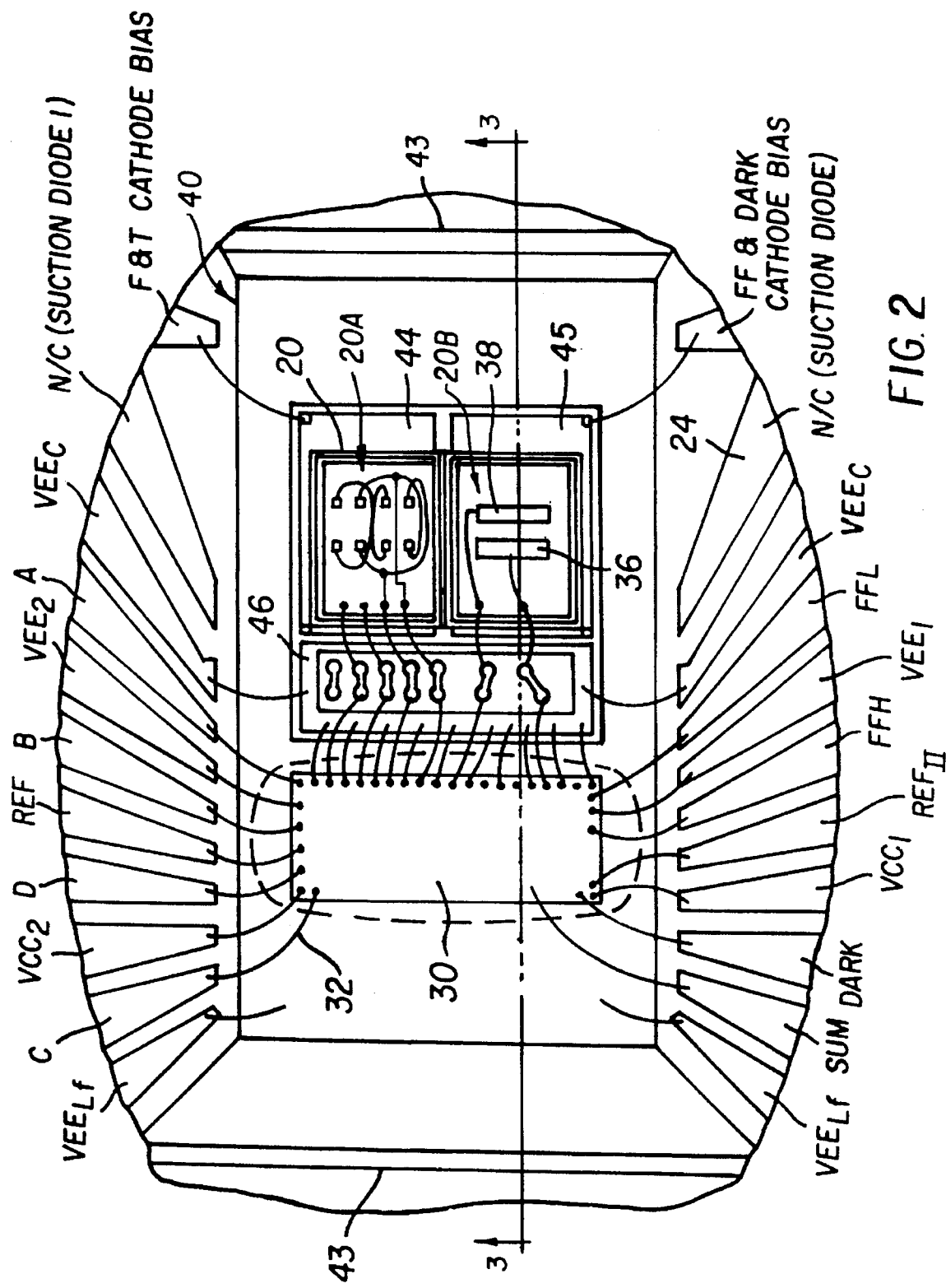
FIG. 2 is a top view of the central portion of the optical detection package of FIG. 1.

FIG. 2 is a top view of a portion of the optical detection package 10. The arrangement of the leadframe fingers 24 and wirebonds 32 that electrically connect the ASIC 30, the detector 20, and the ceramic 40 is clearly visible. Since the wing-shaped support 14 is composed of metal and is therefore conductive in nature, the purpose of the ceramic 40 is to provide a means to electrically isolate the substrate of the positively biased photo detector array 20 (+15 volts) from the gnd biased (0 volts) ASIC 30. This latter bias is applied to the backside substrate of the ASIC die via a conductive die attaching material. The ceramic 40 provides a thermal resistance from the ASIC 30 to the detector array 20 while eliminating chip-to-chip bonding between the detector array 20 and the ASIC 30 resulting in improved reliability. In order to further provide an effective thermal resistance between the ASIC 30 and the detector array 20, the ceramic array has a hole 39 under the detector array (as shown in the cross section of FIG. 3). A pair of leadframe tie bares 43 physically connect to the wing-shaped support 14.

The detector array 20 is comprised of a photo diode array 20A and a front facet detector and dark diode array 20B.

A single monolithic photo detection array is disclosed as the preferred embodiment, but two or more detector arrays could be formed. For example, a first array comprised of the focus and tracking photo detector elements 21A and 21B (see FIG. 5), and a second array comprised of front facet and dark diode detectors, 36 and 38 respectively. Such an arrangement minimizes focus and tracking shunt capacitance which may be desirable in some circuit topology implementations and is realizable via the two die attach print areas 44 and 45. The fingers labeled VEEC are connected to a conductive film 46 on the ceramic 40. The fingers labeled VEELF are connected to ground the lead frame wing.

FIG. 3 illustrates only the portion of the wing-shaped support 14 where the electrical components are attached is shown. This figure is not a true section view of the package, but is provided to show relative positioning of components only. The support 14 is formed of two metal layers, B and C (0.030' thick) with its top surface positioned at the optical reference plane labeled —A—. The leadframe fingers 24 are approximately 0.010" thick and are positioned above layer B (only one is shown in dotted outline form for clarity). The ASIC 30 (0.018–0.020" thick) is mounted directly to the wing-shaped support 14 via a conductive epoxy. The ASIC 30 is coated with an opaque epoxy, "glob top" 42 to prevent the generation of unwanted current because of stray light being sensed at the "p" doped regions of the ASIC 30. The ceramic 40 is also directly mounted to the support 14 via an epoxy. The detector array 20 (0.015–0.0171 thick) is mounted to the ceramic 40 with a conductive epoxy over the hole 39 in support 14. A clear hysol plastic completely encompasses the aforementioned parts at 105 mils thick to form the molded body 12. The window 22 has a depth of 2 μm.

Referring now to FIG. 4, the ASIC 30 consists of a number of transimpedance amplifiers for providing the outputs A, B, C, D, FFH, and FFL, and two reference outputs, REF and REFII. The transimpedance amplifiers sense and condition the photo diode array currents A(d), B(d), C(d), and D(d) which incorporate focus and tracking (F+T) information components, and the signal FF(d) from the photo detector array 20. In addition, a composite RF signal labeled SUM is produced in the ASIC by summing and conditioning the photo diode array currents A(d), B(d), C(d), and D(d).

Figure 5:
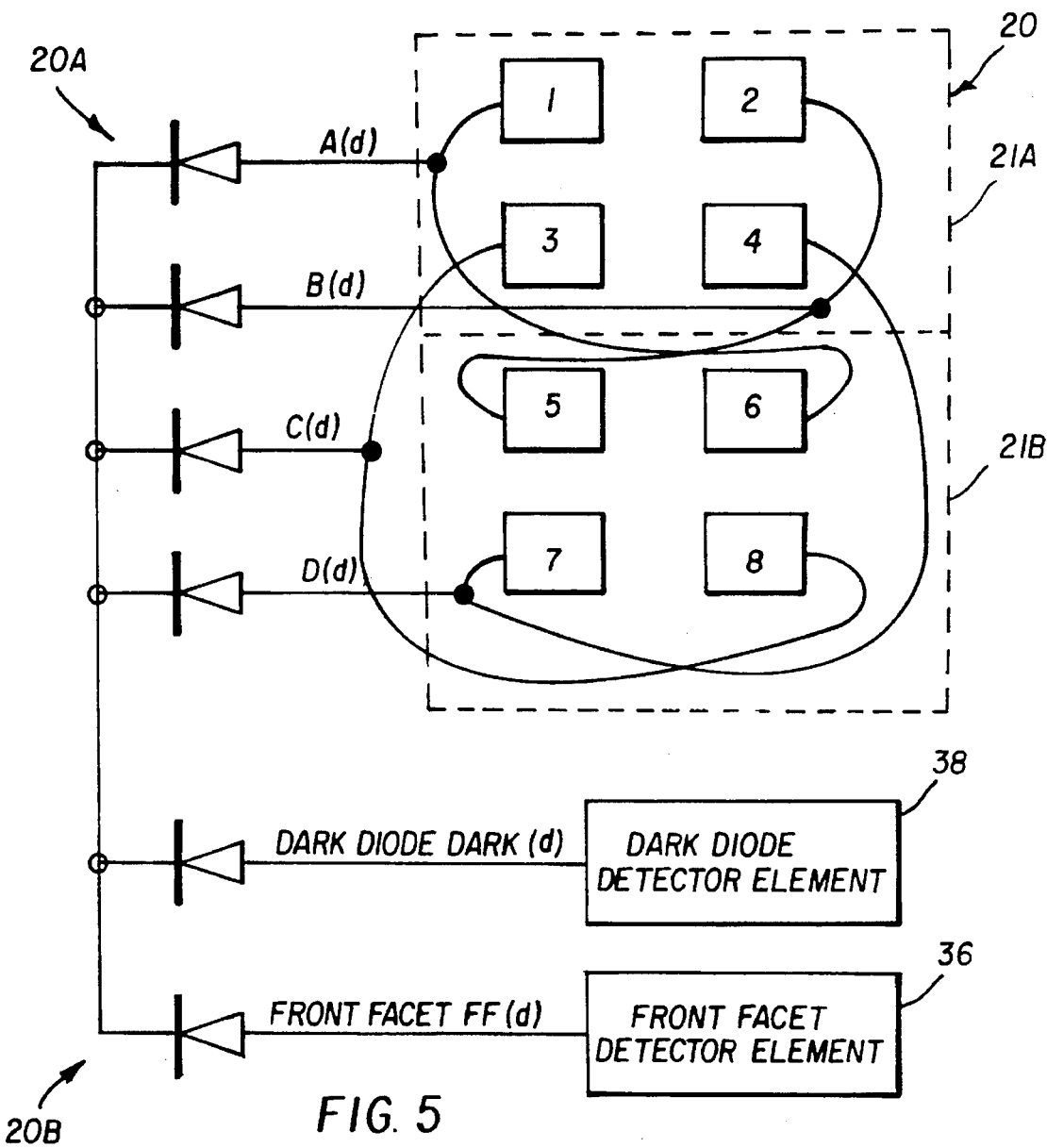
FIG. 5 illustrates, in functional block diagram form, the physical arrangement of the monolithic detector array.
Figure 6:
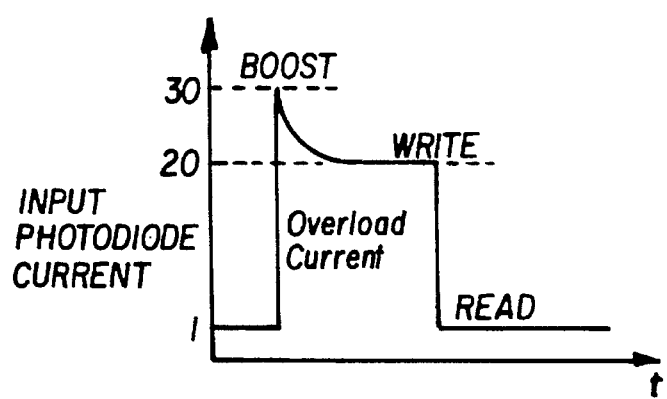
FIG. 6 illustrates, in graphic form, the relationship of input photo diode current to time.

Referring to FIG. 5, in conjunction with FIG. 4 the photo diode array 20A is formed from two cross coupled quad photo detector elements 21A and 21B to provide the detector output currents A(d), B(d), C(d), D(d) whose value is in direct proportion to the amount of light impinging on the photo detectors 1–8 forming the detector elements 21A and 21B. Portions of the focus and tracking error signals are generated from the output currents A(d), B(d), C(c), and D(d) which are converted by the ASIC into representative voltages. In addition, an RF composite Sum signal is derived from the sum of the output currents from the detector elements 21A and 21B {i.e., $\Sigma[A(d)+B(d)+C(d)+D(d)]$} is developed as a SUM voltage in the ASIC. The detector array 20 incorporates a front facet detector and a dark diode to provide the current outputs FF(d) and Dark(d), respectively. The dark diode is used for canceling dark currents, and to measure the temperature of the detector array 20 under operation in the system. The front facet diode current FF(d) is converted to signals FFL and a FFH through a transimpedance conversion by the ASIC. A separate voltage reference for the FF outputs as well as a separate voltage for the A–D/Sum signals is provided to insure noise and offset performance. Various algebraic combinations of the output signals A, B, C, and D are used to define the total focus and tracking error signals by post module electronics. Specifically, focus=(A+C)–(B+D) and tracking=(A+B)–(C+D).

Due to the wide dynamic laser power range required for reading and writing, to a CD disc, writer system amplifiers which are equivalent to the transimpedence amplifiers A–D, front facet amplifiers FFL, FFH and an the RF Sum amplifier are generally classified into two modes of operation: those that remain in the linear range of operation and those that are driven beyond linear operation during, for example, a write operation. The input current FF(d) for FFL and FFH is derived from a single photo diode. The input currents A(d), B(d), C(d) and D(d) for the A, B, C, and D outputs respectively, are derived from a pair of cross coupled quad detectors as previously discussed. The input current $I_{PD}$ for the SUM output is the total photo diode current that flows into the amplifiers with the outputs labeled A through D. The amplifiers on providing the outputs SUM and FFL always operate in a linear range. The amplifiers for providing the outputs A, B, C, D and FFH are driven beyond linear operation during write operations. The current generated in this nonlinear range of operation is generally denoted as a BOOST current and is 30 times the input current levels for linear operation. The output voltage levels of these amplifiers in the overload region and their transient recovery to linear operation are defined by the ASIC 30.

Figure 7:
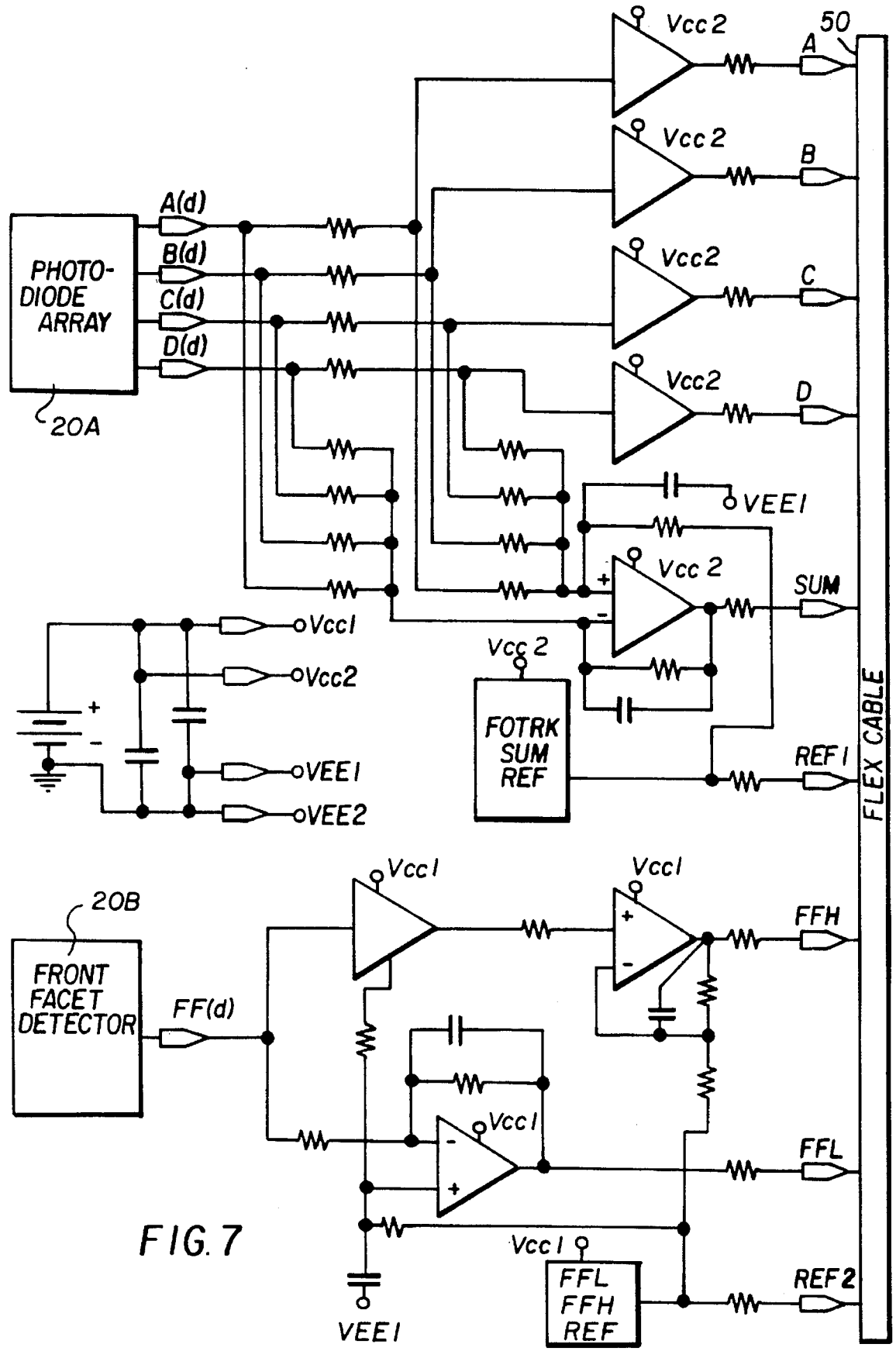
FIG. 7 illustrates in electrical schematic form the circuit diagram of the ASIC used for the custom pre-amps.

FIG. 7 is a detailed circuit diagram of the ASIC 30 that enables replication of the invention. As can be seen, the RF SUM signal is derived from a single resistor divider network of a common input from each of the A–D detector inputs. In addition, FFH (the read power gain input for servo control) and FFL (the writer power gain input for servo control) is derived from a FF(d) input current.

The preferred method of fabricating the optical detector package of the present invention comprises the following steps:

1) Die attach the photo detector array onto the ceramic substrate using conductive epoxy;
2) Mount the photo detector array and the ceramic substrate onto the wing-shaped support;
3) Mount the ASIC onto the wing-shaped support;
4) Wirebond, using 0.00125" of Au (gold) wire, the optical detector package components as follows:
   a) Photo detector array to the ceramic;
   b) Ceramic to the ASIC;
   c) ASIC to the leadframe fingers;
   d) Ceramic to the leadframe fingers;
   e) Photo detector array to the leadframe fingers;
5) Encapsulate the ASIC chip using opaque materials ("glob top");
6) Visually inspect the optical detector package;
7) Transfer mold the optical detector package using clear molding compounds such as Nitto or Hysol MG-18;
8) Trim, form, and deflash electrical leads;
9) Perform final module test; and
10) Visually inspect the optical detector package.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

Parts List

10 Optical detection package
12 Plastic molded body
14 Wing-shaped support
16A Wing-shaped portion
16B Wing-shaped portion
18A Mounting hole
18B Mounting hole
19A Tooling hole
19B Tooling hole
20 Photo detector array
22 window
20A Dual cross coupled quad focus and tracking detectors
20B Front facet detector and dark diode
21A Focus and tracking quad array elements
21B Focus and tracking quad array elements
24 Leadframe fingers
30 ASIC
32 Wirebounds
36 Front facet detector element
38 Dark diode detector element
39 Hole
40 Ceramic substrate
42 "Glob top"
43 Leadframe tie bare
44 Die attach print areas
45 Die attach print areas
46 Conductive film
50 Flex cable

I claim:

1. A packaging assembly for mounting and aligning a focus and tracking photo detector array and front facet detectors to an optical read/write head comprising:

a flat elongated leadframe having a plurality of conductive fingers extending substantially orthogonal to the longitudinal axis of said leadframe and having conductive wing areas extending along said longitudinal axis to opposite ends of said elongated leadframe, said conductive wing areas having alignment indicia for aligning a focus and tracking photo detector array to the optical read/write head;

a ceramic substrate conductively attached to said leadframe;

a focus and tracking photo detector array conductively attached to said ceramic substrate and to the conductive fingers of said leadframe; and a front facet detector conductively attached to said ceramic substrate and to the conductive fingers of said leadframe.

2. The packaging assembly of claim 1, and further comprising:

an ASIC containing a plurality of amplifiers for receiving signals from said focus and tracking photo detector array and said front facet detector and for conditioning the received signals.

3. The packaging assembly of claim 1 wherein the focus and tracking photo detector array is comprised of matched cross coupled quad detectors and focus and tracking preamps with said pre-amps comprised of four monolithically fabricated pre-amps that are closely matched.

4. An integrated optical detection and signal conditioning package, particularly adapted for use as part of an optical recording system's read/write head, comprising:

a monolithic optical detector array comprised of;

a first and a second set of quadrature cells with cells of said first and second sets electrically cross-coupled to form four outputs which relate to focus and tracking error signals, at least one detector element the output of which relates to a front facet signal, at least one detector element the output of which relates to the output of a dark diode;

a plurality of output pins electrically connected to said circuit interconnections of said substrate;

a monolithic ASIC comprised of;

at least two tightly matched preamplifiers having inputs and outputs, with the inputs electrically attached to at least two outputs relating to focus and tracking error signals of said monolithic optical detector array, a first set of at least two less tightly matched preamplifiers, having inputs and outputs, with the inputs electrically attached to at least two outputs relating to focus and tracking signals of said monolithic optical detector array, which outputs are electrically attached to package output pins relating to focus and tracking signals which will be summed, differenced, and/or normalized off the head, a second set of at least two tightly matched preamplifiers having inputs and outputs, with the inputs electrically attached to one output relating to a front facet signal of said monolithic optical detector array, and outputs of which are electrically attached to package output pins relating to a front facet HI signal for read power level determination and a front facet LO signal for write power level determination, at least one preamplifier having inputs and outputs, with the inputs electrically attached to all detector generated outputs relating to focus and tracking signals of said monolithic detector array, and whose outputs are electrically attached to package output pins relating to a RF SUM signal.

* * * * *